United States Patent
Baliga et al.

(10) Patent No.: US 7,793,170 B2
(45) Date of Patent: Sep. 7, 2010

(54) METHOD AND APPARATUS FOR COMBINING DE-INTERLEAVING WITH FFT AND DEMAPPING

(75) Inventors: Roshan Rajendra Baliga, Bangalore (IN); Rahul Garg, Haryana (IN); Rajendra Kumar, Bangalore (IN); Sreenath Ramanath, Bangalore (IN)

(73) Assignee: Ittiam Systems (P) Ltd., Bangalore, Karnataka (IN)

( * ) Notice: Subject to any disclaimer, the term of this patent is extended or adjusted under 35 U.S.C. 154(b) by 1621 days.

(21) Appl. No.: 11/028,900

(22) Filed: Jan. 3, 2005

(65) Prior Publication Data

US 2005/0257112 A1    Nov. 17, 2005

Related U.S. Application Data

(60) Provisional application No. 60/570,721, filed on May 13, 2004.

(51) Int. Cl.
*G11C 29/00*    (2006.01)
(52) U.S. Cl. .................. 714/702; 714/746; 714/749

(58) Field of Classification Search ................ 714/702, 714/746, 749, 795, 794, 784; 370/208; 455/179.1; 708/404

See application file for complete search history.

(56) References Cited

U.S. PATENT DOCUMENTS

| | | | | |
|---|---|---|---|---|
| 5,416,801 A | * | 5/1995 | Chouly et al. | 375/260 |
| 6,625,113 B1 | * | 9/2003 | Cupo et al. | 370/208 |
| 6,778,591 B2 | * | 8/2004 | Sato | 375/147 |
| 6,898,198 B1 | * | 5/2005 | Ryan et al. | 370/338 |
| 6,987,798 B2 | * | 1/2006 | Ahn et al. | 375/148 |
| 7,170,849 B1 | * | 1/2007 | Arivoli et al. | 370/208 |
| 7,184,726 B2 | * | 2/2007 | Shibata | 455/179.1 |
| 7,315,878 B2 | * | 1/2008 | Han | 708/404 |

* cited by examiner

*Primary Examiner*—Fritz Alphonse
(74) *Attorney, Agent, or Firm*—Prakash Nama; Global IP Services, PLLC

(57) ABSTRACT

A novel technique for combining deinterleaving operation with Fast Fourier Transformer (FFT) modules and other post FFT modules in a receiver to reduce processing time. In one example embodiment, the deinterleaving operation, in the post FFT module, is combined with FFT and demapper operations to reduce the processing time and complexity.

19 Claims, 4 Drawing Sheets

METHOD AND APPARATUS FOR COMBINING DE-INTERLEAVING WITH FFT AND DEMAPPING

RELATED APPLICATION

Benefit is claimed under 35 U.S.C. 119(e) to U.S. Provisional Application Ser. No. 60/570,721, entitled "Method and Apparatus for Combining de-interleaving with FFT and Demapping" by inventor Rahul G et al., filed May 13, 2004, which is herein incorporated in its entirety by reference for all purposes.

TECHNICAL FIELD OF THE INVENTION

The present invention relates generally to digital communication systems and more particularly to an orthogonal frequency division multiplexing (OFDM) based communication systems.

BACKGROUND OF THE INVENTION

OFDM is becoming increasingly popular in design of high data rate communication systems. In OFDM systems, a single high rate data stream is divided into several parallel low rate sub streams, with each sub stream being used to modulate a respective sub carrier frequency. This is generally accomplished by broadcasting the high rate data using a transmitter to a receiver from one or more essentially identical transmitters via multiple air interface paths.

The transmitter in an OFDM system receives a stream of digital data bits to be transmitted. The received digital data bits are then scrambled and convolutionally encoded per well-known principles. The data bits are then sent to an interleaver to interleave the bits. The interleaved bits are then signal-space mapped to produce a stream of complex symbols. After mapping, the stream of complex symbols is then transformed to time domain by an inverse fast Fourier transformer (IFFT). Guard intervals are then established and the data bits are transmitted.

The receiver then receives the transmitted data bits and sends them to a guard interval remover, which removes the guard intervals inserted by the transmitter. From the guard interval remover the data bits are then sent to a fast Fourier transformer (FFT) for transforming the signal back into frequency domain. The FFT then outputs a stream of complex symbols in a single sequence of data bits. The complex symbols are then demapped and inputted into a de-interleaver for reordering bits into the order they were in before being interleaved by the interleaver of the transmitter. De-interleaving is a reverse process, which restores the original sequence from the interleaved sequence. Next, the deinterleaved data bits are sent to a decoder for decoding the bits in accordance with the convolutional coding schemes well known in the art.

The interleaver at the transmitter, in such OFDM based communication systems, scrambles a signal over a certain time interval, by reordering the data bits. Typically, block interleavers are employed, where a signal is scrambled by writing the data bits into rows and reading them out in columns, in a known manner. If block-coded symbols are interleaved over a time duration of many blocks before transmission, symbols associated with a lost packet will be deinterleaved by the receiver and found among many different coded blocks.

Also, in OFDM-based communication systems, the de-interleaver at the receiver has to be synchronized to the interleaver. In order to synchronize the de-interleaver to perform the de-interleaving, the data bits coming from the demapper have to be first stored in a buffer and then the de-interleaving has to be performed. The time required to fill the buffer with the data bits in order to synchronize the de-interleaver can be significant and can affect the synchronization. This can result in not meeting the receiver processing time generally required by a packet based communication system. This can degrade the performance significantly. In addition, the amount of memory required to store the data bits in the buffer can be significant. Further, such process of storing the data bits in the buffer and performing the de-interleaving operation by retrieving the stored data bits can result in a significant delay, overhead information, additional processing, and synchronization problems.

SUMMARY OF THE INVENTION

The present subject matter provides an efficient multicarrier receiver that reduces processing time and complexity. In one example embodiment, the deinterleaving operation is combined with the FFT and demapper operations to reduce processing time and complexity. In this example embodiment, a Fourier transformer transforms stored data signals into symbols and stores the transformed symbols in an output buffer. A demapper then reads out the stored symbols from the output buffer in a symbol-deinterleaved order and converts the read symbols into bits. Further, the demapper outputs the converted bits in a bit-deinterleaved order. In another example embodiment, interleaving operation is combined with IFFT and mapper operations to reduce the processing time and complexity of a transmitter.

DETAILED DESCRIPTION OF THE INVENTION

The present subject matter provides a novel technique to reduce processing time in a packet based communication system. In addition, the technique reduces complexity in terms of chip area and timeline in the post FFT modules of a receiver. In one example embodiment, the deinterleaving operation is combined with FFT and demapper operations to reduce processing time and complexity.

In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1:
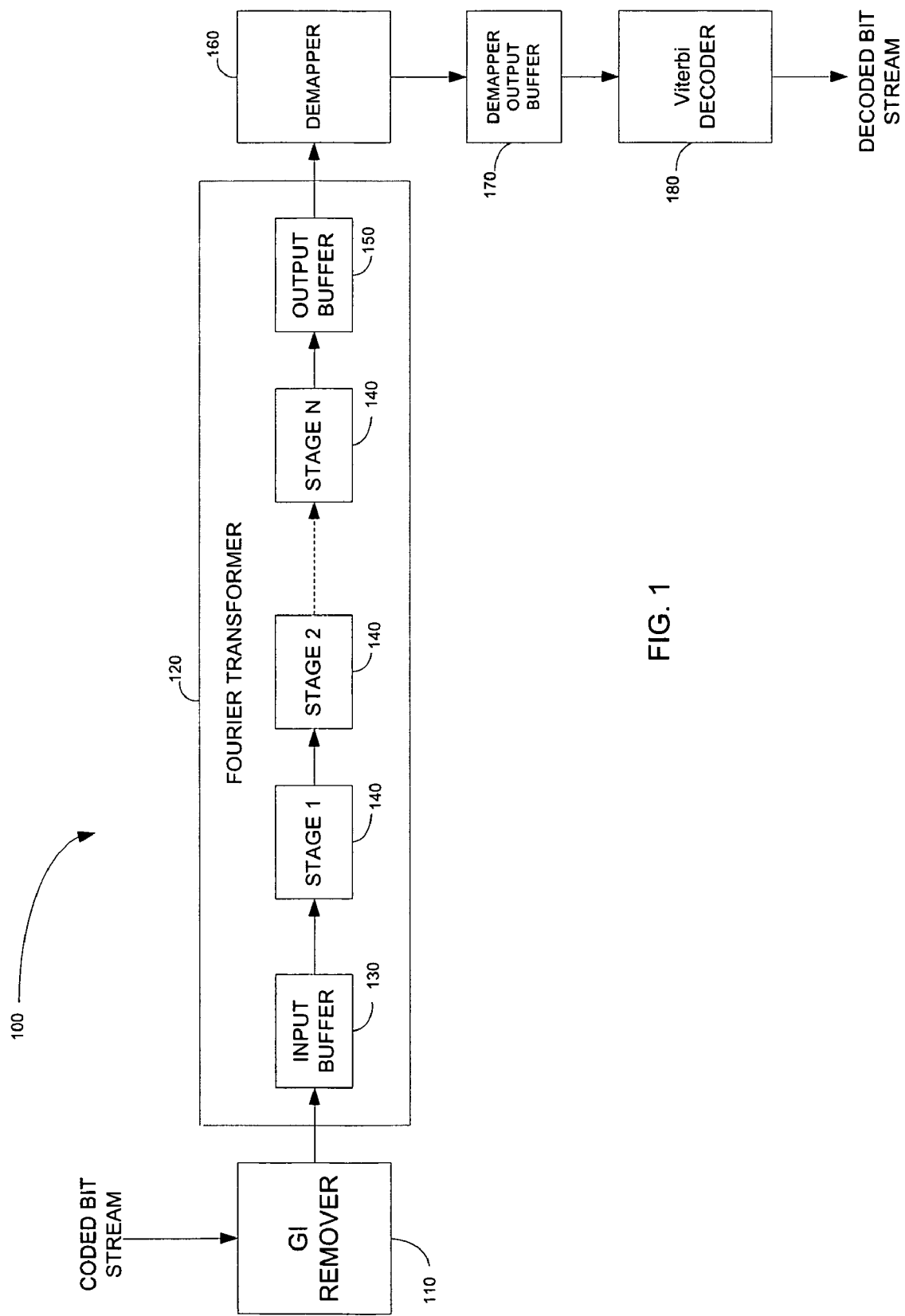
FIG. 1 is a block diagram illustrating an example receiver implemented according to various embodiments of the present invention.

FIG. 1 is a block diagram 100 illustrating an example receiver of a packet based communication system according to the various embodiments of the present subject matter. The block diagram 100 shown in FIG. 1 illustrates a guard interval (GI) remover 110, a Fourier transformer 120, a demapper 160, a demapper output buffer 170, and a decoder 180. As shown in FIG. 1, the Fourier transfer 120 includes an input buffer 130, multiple stages (stages 1 ... N) 140, and an output buffer 150. The Fourier transformer 120 is coupled between the input buffer 130 and the demapper 160. The decoder 180 is coupled to the demapper output buffer 170. In some embodiments, the decoder 170 is a Viterbi decoder.

In operation, in one example embodiment, GI remover 110 receives coded data signals sequentially from a remote transmitter via multipath channels. In some embodiments, the transmitter is an RP transmitter. The GI remover 110 then removes the guard intervals inserted by a GI adder in a transmitter by processing only the energy received during the useful signal period. The data signals are then stored in the input buffer 130.

In one example embodiment, the Fourier transformer 120 transforms sequentially the received data signals into symbols and stores the transformed symbols in the output buffer 150. In these embodiments, the Fourier transformer 120 reads the stored data signals sequentially from the input buffer 130. In some embodiments, the Fourier transformer 120 transforms the read data signals into symbols by processing the read data signals using one or more of the plurality of stages 140. The output buffer 150 then stores the outputted symbols. In other embodiments, the Fourier transformer 120 outputs the symbols in a symbol-deinterleaved order. In these embodiments, the output buffer 150 stores the symbols in the symbol-deinterleaved order. The data signals are then transformed using a transform function, such as a fast Fourier transformer (FFT), a discrete cosine transformer, a Wavelet transformer, a Walsh transformer, and other such transform functions.

The demapper 160 then retrieves the symbols in the symbol-deinterleaved order from the output buffer 150 and demaps the retrieved symbols into demapped bits. In some embodiments, the demapper 160 then outputs the demapped bits in a bit-deinterleaved order. The decoder 180 then receives the demapped bits from the demapper 160 and decodes the demapped bits to output a decoded signal. In some embodiments, the demapper 160 demaps all the demapped bits in the transformed symbols in either a serial or a parallel manner.

In some embodiments, the demapped bits outputted by the demapper 160 are stored in the demapper output buffer 170. In these embodiments, the decoder 170 reads out the demapped bits in the bit-deinterleaved order from the demapper output buffer 170 and decodes the demapped bits into a decoded signal and outputs the decoded signal.

In other embodiments, the demapped bits outputted by the demapper 160 are stored in the demapper output buffer 170 in the bit-deinterleaved order. In these embodiments, the decoder 180 then reads out the demapped bits in the bit-deinterleaved order from the demapper output buffer 170 and decodes the demapped bits in the bit-deinterleaved order and output the decoded signal.

Figure 2:
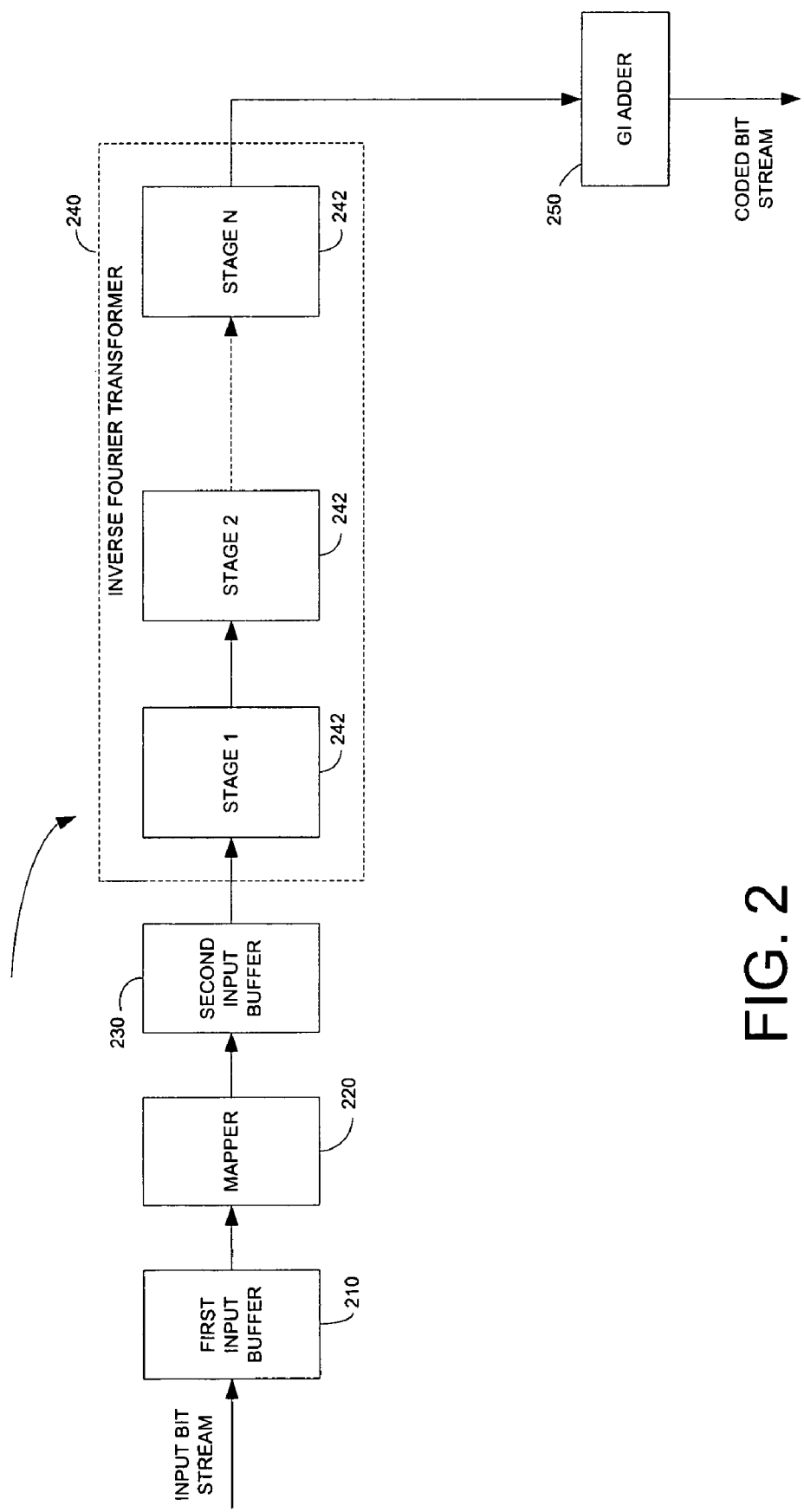
FIG. 2 is a block diagram illustrating an example transmitter implemented according to various embodiments of the present invention.

FIG. 2 is a block diagram 200 illustrating an example transmitter of a communication system according to the various embodiments of the present invention. The block diagram 200 shown in FIG. 2 illustrates a first input buffer 210, a mapper 220, a second input buffer 230, an inverse Fourier transformer 240, and a GI adder 250.

As shown in FIG. 2, the inverse Fourier transformer 240 includes a plurality of stages (stages 1 ... N) 242. The inverse Fourier transformer 240 is coupled between the second input buffer 230 and the GI adder 250.

In operation, in one example embodiment, the first input buffer 210 receives an input bit stream including a sequence of bits from a receiver and stores the received bits. The mapper 220 then reads out the stored bits from the first input buffer 210 and converts the read bits into mapped symbols.

The second input buffer 230 then stores the mapped symbols in a symbol-interleaved order. In some embodiments, the mapper 220 reads out the stored bits from the first input buffer 210 in a bit-interleaved order and converts the bits into mapped symbols. The mapped symbols are then outputted in a bit-interleaved order. In these embodiments, the second input buffer 230 stores the mapped symbols in the bit-interleaved order.

The inverse Fourier transformer 240 then reads out the mapped symbols in the symbol-interleaved order from the second input buffer 230 and converts the read mapped symbols into a coded bit stream. In some embodiments, one or more of the plurality of stages in the inverse Fourier transformer is used to convert the mapped symbols into the coded bit stream. In some embodiments, the second input buffer 230 receives the mapped symbols in the bit-interleaved order and stores them in the symbol-interleaved order. In these embodiments, the inverse Fourier transformer 240 then reads out the mapped symbols in the order the mapped symbols were stored in the second input buffer 230 and converts the mapped symbols in to the coded bit stream. In one embodiment, the inverse Fourier transformer 140 reads out the mapped symbols from the second input buffer 230 and converts the mapped symbols into a data signal. In these embodiments, data signals include the symbols that are symbol-interleaved using one or more stages of the inverse Fourier transformer 240.

The GI adder 250 receives the data signal from the inverse Fourier transformer 250 and adds guard intervals to the data signal. In one embodiment, the GI adder 250 then receives the coded bit stream from the inverse Fourier transformer 240 and adds guard intervals to data signals in the coded bit stream.

Figure 3:
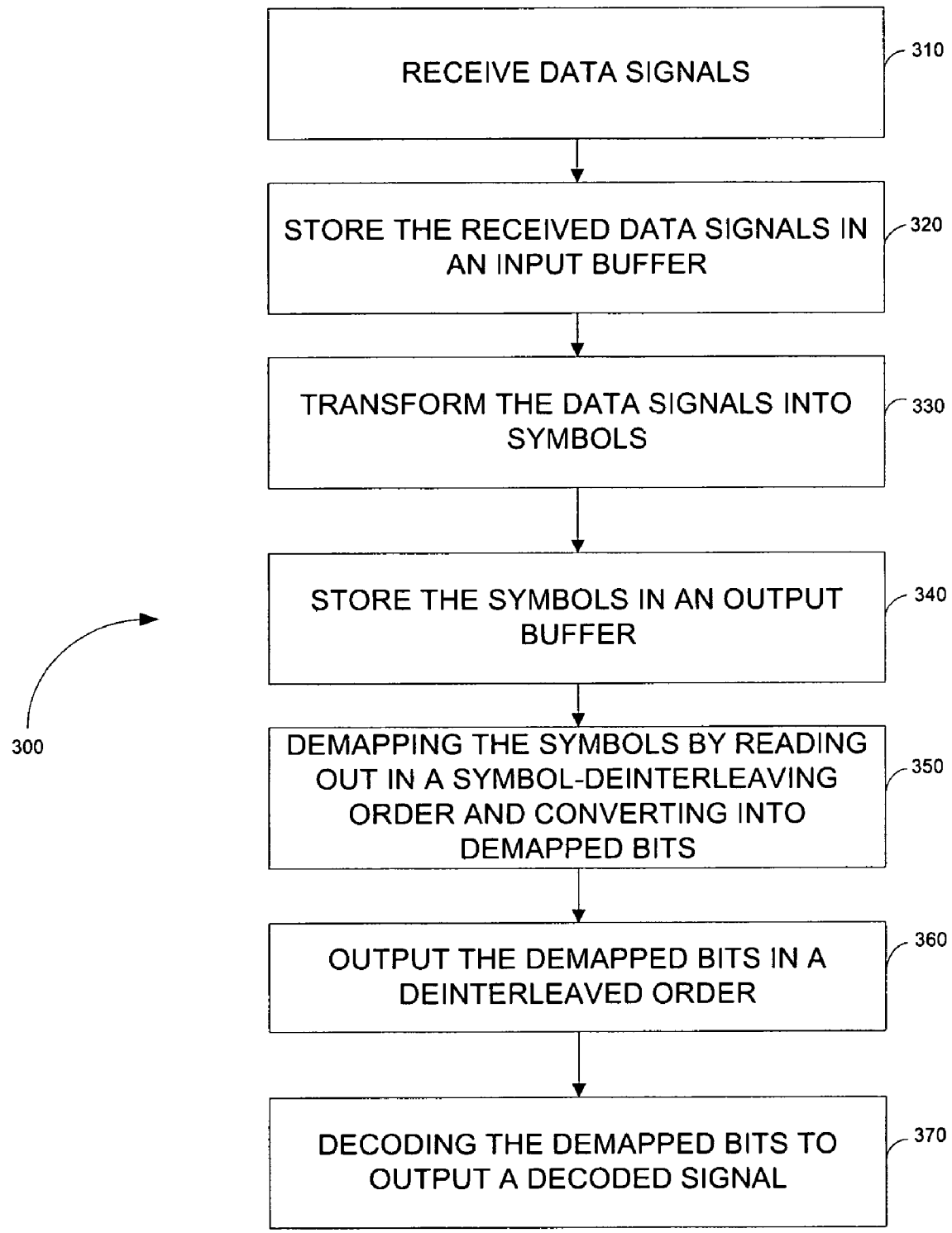
FIG. 3 is a flowchart illustrating a technique of combining de-interleaving with FFT and demapping according to various embodiments of the present invention.

FIG. 3 is a flowchart illustrating an example embodiment of a method 300 of reducing processing time in a receiver of a packet based communication system according to the various embodiments of the present invention. At 310, the method 300 in this example embodiment receives data signals from a transmitter.

At 320, the received data signals are stored in an input buffer. In some embodiments, guard intervals inserted by a transmitter are removed before storing the data signals in the input buffer. At 330, stored data signals are then read sequentially and transformed into symbols, i.e., transformed back to time domain by a Fourier transformer. The symbols are complex data symbols. In some embodiments, the data signals are transformed into symbols using transform functions, such as a fast Fourier transformer (FFT), discrete cosine transformer, Wavelet transformer, and Walsh transformer.

At 340, the symbols are stored sequentially in an output buffer. At 350, the stored symbols are demapped by reading out the symbols from the output buffer in a symbol-deinterleaved order and converted to demapped bits using a demapper. At 360, the demapped bits are outputted in a bit-deinterleaved order by the demapper. At 370, the demapped bits are then decoded and a decoded signal is outputted by the receiver.

Similarly, it can be envisioned that the above technique can be used to reduce the processing time in a transmitter of a packet based communication system according to the various embodiments of the present invention. In one example embodiment, a sequence of bits is stored in a bit-interleaved order in a first input buffer. The stored bits are then read out in a bit-interleaved order and converted to mapped symbols by using a mapper. The mapped symbols are then stored in an output buffer. The stored mapped symbols are then read out in a symbol-interleaved order and transformed into the coded bit stream using an inverse Fourier transformer. The guard intervals are then added to data signals in the coded bit stream and transmitted by the transmitter. The operation of the various embodiments of the method 300 is described in more detail with reference to FIGS. 1 and 2.

Although the method 300 includes acts 310-370 that are arranged serially in the exemplary embodiments, other embodiments of the present subject matter may execute two or more acts in parallel, using multiple processors or a single processor organized two or more virtual machines or sub-processors. Moreover, still other embodiments may implement the acts as two or more specific interconnected hardware modules with related control and data signals communicated between and through the modules, or as portions of an application-specific integrated circuit. Thus, the exemplary process flow diagrams are applicable to software, firmware, and/or hardware implementations.

Various embodiments of the present invention can be implemented in software, which may be run in the environment shown in FIG. 4 (to be described below) or in any other suitable computing environment. The embodiments of the present invention are operable in a number of general-purpose or special-purpose computing environments. Some computing environments include personal computers, general-purpose computers, server computers, hand-held devices (including, but not limited to, telephones and personal digital assistants of all types), laptop devices, multi-processors, microprocessors, set-top boxes, programmable consumer electronics, network computers, minicomputers, mainframe computers, distributed computing environments and the like to execute code stored on a computer-readable medium. The embodiments of the present invention may be implemented in part or in whole as machine-executable instructions, such as program modules that are executed by a computer. Generally, program modules include routines, programs, objects, components, data structures, and the like to perform particular tasks or to implement particular abstract data types. In a distributed computing environment, program modules may be located in local or remote storage devices.

Figure 4:
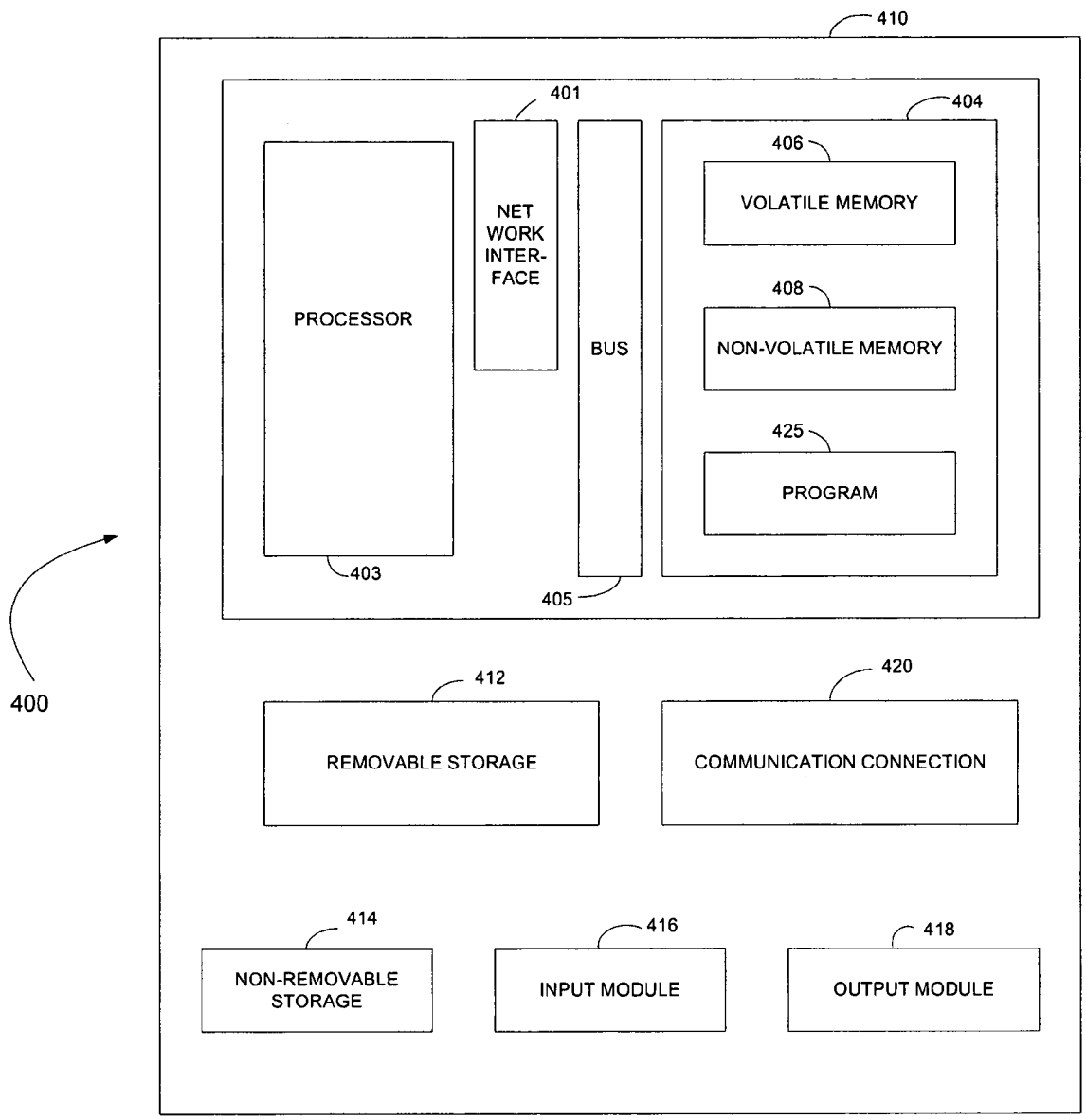
FIG. 4 is an example of a suitable computing environment for implementing various embodiments of the present invention.

FIG. 4 shows an example of a suitable computing system environment for implementing embodiments of the present invention. FIG. 4 and the following discussion are intended to provide a brief, general description of a suitable computing environment in which certain embodiments of the inventive concepts contained herein may be implemented.

A general computing device, in the form of a computer 410, may include a processor 403, memory 404, removable storage 412, and non-removable storage 414. Computer 410 additionally includes a bus 405 and a network interface (NI) 401.

Computer 410 may include or have access to a computing environment that includes an input module 416, an output module 418, and one or more communication connections 420 such as a network interface card or a USB connection. The computer 410 may operate in a networked environment using the communication connection 420 to connect to one or more remote computers. A remote computer may include a personal computer, server, router, network PC, a peer device or other network node, and/or the like. The communication connection may include a Local Area Network (LAN), a Wide Area Network (WAN), and/or other networks.

The memory 404 may include volatile memory 406 and non-volatile memory 408. A variety of computer-readable media may be stored in and accessed from the memory elements of computer 410, such as volatile memory 406 and non-volatile memory 408, removable storage 412 and non-removable storage 414. Computer memory elements can include any suitable memory device(s) for storing data and machine-readable instructions, such as read only memory (ROM), random access memory (RAM), erasable programmable read only memory (EPROM), electrically erasable programmable read only memory (EEPROM), hard drive, removable media drive for handling compact disks (CDs), digital video disks (DVDs), diskettes, magnetic tape cartridges, memory cards, Memory Sticks™, and the like; chemical storage; biological storage; and other types of data storage.

"Processor" or "processing unit," as used herein, means any type of computational circuit, such as, but not limited to, a microprocessor, a microcontroller, a complex instruction set computing (CISC) microprocessor, a reduced instruction set computing (RISC) microprocessor, a very long instruction word (VLIW) microprocessor, explicitly parallel instruction computing (EPIC) microprocessor, a graphics processor, a digital signal processor, or any other type of processor or processing circuit. The term also includes embedded controllers, such as generic or programmable logic devices or arrays, application specific integrated circuits, single-chip computers, smart cards, and the like.

Embodiments of the present invention may be implemented in conjunction with program modules, including functions, procedures, data structures, application programs, etc., for performing tasks, or defining abstract data types or low-level hardware contexts.

Machine-readable instructions stored on any of the above-mentioned storage media are executable by the processor 402 of the computer 410. For example, a computer program 425 may comprise machine-readable instructions capable of transforming the data signals into symbols according to the various embodiments of the present invention. The symbols are then demapped, by reading out in an order required by a deinterleaver, to demap the symbols into bits and outputting the demapped bits in a bit-deinterleaved order according to the teachings and herein described embodiments of the present invention. Also, for example, the computer program 425 may comprise machine-readable instructions capable of transforming mapped symbols into a coded bit stream according to the teachings and herein described embodiments of the present invention. In one embodiment, the computer program 425 may be included on a CD-ROM and loaded from the CD-ROM to a hard drive in non-volatile memory 408. The machine-readable instructions cause the computer 410 to encode an audio signal on a band-by-band basis by shaping quantization noise in each band using its local gain according to some embodiments of the present invention.

The above description is intended to be illustrative, and not restrictive. Many other embodiments will be apparent to those skilled in the art. The scope of the invention should therefore be determined by the appended claims, along with the full scope of equivalents to which such claims are entitled.

The invention claimed is:

1. A receiver comprising:
a multistage Fourier transformer that transforms sequentially received data signals into symbols such that the symbols are obtained in a symbol de-interleaved order;
an output buffer that receives and stores the symbols in the symbol de-interleaved order;
a demapper that retrieves the symbols from the output buffer in the symbol de-interleaved order, demaps the retrieved symbols in a serial manner into demapped bits and outputs the demapped bits in a bit-deinterleaved order;
a demapper output buffer coupled to the demapper, wherein the demapper demaps the bits in the symbols in a parallel manner and stores the demapped bits in the demapper output buffer; and
a decoder that retrieves the demapped bits from the demapper output buffer in a bit-deinterleaved order and decodes the demapped bits and outputs a decoded bit stream.

2. The receiver of claim 1, wherein the multistage Fourier transformer comprises a fast Fourier transformer (FFT), wherein the fast Fourier transformer has multiple stages to transform the received data signals into symbols.

3. A receiver comprising:
a multistage Fourier transformer that transforms sequentially received data signals into symbols such that the symbols are obtained in a symbol de-interleaved order;
an output buffer that receives and stores the symbols in the symbol de-interleaved order;
a guard interval remover that receives the data signals sequentially from a transmitter and removes the guard intervals in the data signals; and an input buffer for storing the received data signals, and wherein the Fourier transformer reads the stored data signals.

4. The receiver of claim 3, further comprising:
a demapper that retrieves the symbols from the output buffer in the symbol de-interleaved order, demaps the retrieved symbols in a serial manner into demapped bits and outputs the demapped bits in a bit-deinterleaved order.

5. The receiver of claim 4, further comprising:
a demapper output buffer coupled to the demapper, wherein the demapper demaps the bits in the symbols in a parallel manner and stores the demapped bits in the demapper output buffer in the bit-deinterleaved order.

6. The receiver of claim 5, further comprising:
a decoder for decoding the demapped bits and to output a decoded bit stream.

7. The receiver of claim 3, wherein the multistage Fourier transformer comprises a fast Fourier transformer (FFT), wherein the fast Fourier transformer has multiple stages to transform the received data signals into symbols.

8. A receiver comprising:
a multistage Fourier transformer that transforms a sequence of data signals into symbols by processing the data signals;
an output buffer that stores the symbols;
a demapper for reading out the symbols from the output buffer in the symbol-deinterleaved order and to convert the symbols into demapped bits;
a demapper output buffer coupled to the demapper, wherein the demapper reads the symbols from the output buffer in a symbol-deinterleaved order and demaps the bits in a parallel manner, and wherein the demapped bits are stored in the demapper output buffer; and a decoder reads the demapped bits from the demapper output buffer in a bit-deinterleaved order and decodes the demapped bits and outputs a decoded bit stream.

9. A receiver comprising:
a multistage Fourier transformer that transforms a sequence of data signals into symbols by processing the data signals;
an output buffer that stores the symbols;
a demapper for reading out the symbols from the output buffer in the symbol-deinterleaved order and to convert the symbols into demapped bits;
a guard interval remover to receive the data signals sequentially from a transmitter and to remove the guard intervals in the data signals; and
an input buffer for storing the received data signals, wherein the Fourier transformer reads the sequence of data signals from the input buffer.

10. The receiver of claim 9, wherein the demapper reads the symbols from the output buffer in a symbol-deinterleaved order and demaps the bits in a serial manner, and wherein the demapper outputs the demapped bits in a bit-deinterleaved order.

11. The receiver of claim 9, further comprising:
a demapper output buffer coupled to the demapper, wherein the demapper reads the symbols from the output buffer in a symbol-deinterleaved order and demaps the bits in a parallel manner, and wherein the demapped bits are stored in a bit-deinterleaved order in the demapper output buffer.

12. The receiver of claim 9, further comprising:
a decoder that receives the demapped bits in the bit-deinterleaved order from the demapper and decodes the demapped bits and outputs a decoded signal.

13. A receiver comprising:
an input buffer to receive a sequence of data signals and to store the data signals;
a multistage Fourier transformer coupled to the input buffer that retrieves the stored data signals and transforms the retrieved data signals into symbols such that the outputted symbols are in the symbol de-interleaved order;
an output buffer that receives the symbols and stores the symbols in the received symbol de-interleaved order;
a demapper for reading out the symbols from the output buffer in the symbol deinterleaved order and to convert the symbols into demapped bits and outputs the bits in a bit-deinterleaved order;
a demapper output buffer coupled to the demapper that stores the demapped bits in the bit-deinterleaved order; and
a decoder coupled to the demapper output buffer that retrieves the demapped bits from the demapper output buffer and decodes the retrieved demapped bits and outputs a decoded bit stream.

14. A receiver comprising:
an input buffer to receive a sequence of data signals and to store the data signals;
a multistage Fourier transformer coupled to the input buffer that retrieves the stored data signals and transforms the retrieved data signals into symbols;
an output buffer that stores the symbols;
a demapper coupled to the output buffer that retrieves the symbols from the output buffer in a symbol de-interleaved order and demaps the retrieved symbols into demapped bits in a bit-deinterleaved order;

a demapper output buffer coupled to the demapper that stores the demapped bits in the bit-deinterleaved order; and a decoder coupled to the demapper output buffer that retrieves the demapped bits from the demapper output buffer and decodes the retrieved demapped bits and outputs a decoded bit stream.

15. The receiver of claim 14, further comprising:

a guard interval remover to receive the data signals sequentially from a transmitter and to remove the guard intervals in the data signals.

16. A method comprising:

receiving the data signals sequentially from a transmitter;

storing the received data signals in an input buffer;

transforming received data signals into symbols using a Fourier transformer, wherein transforming the symbols using the stored data signals comprises:

transforming the stored data signals to the symbols using a transformer selected from the group consisting of a Fourier transformer, a fast Fourier transformer, a discrete cosine transformer, a Wavelet transformer, and a Walsh transformer;

storing the symbols in an output buffer;

demapping by reading out the stored symbols from the output buffer in a symbol-deinterleaved order and converting the read symbols into demapped bits using a demapper; and outputting the converted demapped bits in a bit-deinterleaved order by the demapper.

17. The method of claim 16, further comprising:

decoding the demapped bits to output a decoded signal.

18. A computer readable medium having instructions that, when executed by a computer, causes the computer to perform a method for transforming sequentially received data signals into symbols such that the symbols are obtained in a symbol de-interleaved order, comprising:

receiving the data signals sequentially from a transmitter;

storing the received data signals in an input buffer;

transforming received data signals into symbols using a Fourier transformer, wherein transforming the symbols using the stored data signals comprises:

transforming the stored data signals to the symbols using a transformer selected from the group consisting of a Fourier transformer, a fast Fourier transformer, a discrete cosine transformer, a Wavelet transformer, and a Walsh transformer;

storing the symbols in an output buffer;

demapping by reading out the stored symbols from the output buffer in a symbol de-interleaved order and converting the read symbols into demapped bits using a demapper; and outputting the converted demapped bits in a bit-deinterleaved order by the demapper.

19. The computer readable medium of claim 18, further comprising:

receiving the data signals sequentially from a transmitter; and storing the received data signals in an input buffer.

\* \* \* \* \*